(12) United States Patent
Tomioka et al.

(10) Patent No.: US 12,092,932 B2
(45) Date of Patent: Sep. 17, 2024

(54) LIQUID CRYSTAL DISPLAY DEVICE

(71) Applicant: Japan Display Inc., Tokyo (JP)

(72) Inventors: Yasushi Tomioka, Tokyo (JP); Yosuke Hyodo, Tokyo (JP); Hidehiro Sonoda, Tokyo (JP); Noboru Kunimatsu, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 18/408,683

(22) Filed: Jan. 10, 2024

(65) Prior Publication Data

US 2024/0142830 A1 May 2, 2024

Related U.S. Application Data

(63) Continuation of application No. 18/140,006, filed on Apr. 27, 2023, now Pat. No. 11,906,857, which is a
(Continued)

(30) Foreign Application Priority Data

Oct. 31, 2013 (JP) ................................. 2013-226910

(51) Int. Cl.
*G02F 1/1343* (2006.01)
*G02F 1/1333* (2006.01)
*G02F 1/1335* (2006.01)
*G02F 1/1337* (2006.01)
*G02F 1/1362* (2006.01)
(Continued)

(52) U.S. Cl.
CPC .. *G02F 1/134363* (2013.01); *G02F 1/133345* (2013.01); *G02F 1/133512* (2013.01); *G02F 1/133514* (2013.01); *G02F 1/133788* (2013.01); *G02F 1/136227* (2013.01); *G02F 1/1368* (2013.01); *H01L 27/1218* (2013.01); *G02F 2202/02* (2013.01)

(58) Field of Classification Search
CPC ......... G02F 1/134363; G02F 1/133345; G02F 1/133512; G02F 1/133514; G02F 1/133788; G02F 1/136227; G02F 1/1368; G02F 2202/02; H01L 27/1218
See application file for complete search history.

(56) References Cited

U.S. PATENT DOCUMENTS

| 6,307,611 | B1 * | 10/2001 | Kim | G02F 1/136227 |
| | | | | 349/138 |
| 2006/0238676 | A1 * | 10/2006 | Yang | G02F 1/133555 |
| | | | | 349/114 |
| 2007/0298538 | A1 * | 12/2007 | Tanabe | G02F 1/1368 |
| | | | | 438/107 |

* cited by examiner

*Primary Examiner* — Anne M Hines
(74) *Attorney, Agent, or Firm* — Michael Best & Friedrich LLP

(57) ABSTRACT

In a liquid crystal display device, a common electrode is formed on an organic passivation film, an interlayer insulating film is formed on the common electrode, a pixel electrode with a slit is formed on the interlayer insulating film, and a through hole is formed in the organic passivation film and the interlayer insulating film, so that the pixel electrode is connected to a source electrode of a TFT through the through hole. Further, the taper angle around the upper base of the through hole is smaller than the taper angle around the lower base. Thus, the alignment film material can easily flow into the through hole when the diameter of the through hole is reduced to connect the pixel and source electrodes, preventing display defects such as uneven brightness due to the absence of the alignment film or due to the alignment film irregularity around the through hole.

9 Claims, 9 Drawing Sheets

Related U.S. Application Data continuation of application No. 17/946,602, filed on Sep. 16, 2022, now Pat. No. 11,668,982, which is a continuation of application No. 17/475,403, filed on Sep. 15, 2021, now Pat. No. 11,480,833, which is a continuation of application No. 16/953,997, filed on Nov. 20, 2020, now Pat. No. 11,150,523, which is a continuation of application No. 16/273,586, filed on Feb. 12, 2019, now Pat. No. 10,877,325, which is a continuation of application No. 16/158,402, filed on Oct. 12, 2018, now Pat. No. 10,247,990, which is a continuation of application No. 16/014,024, filed on Jun. 21, 2018, now Pat. No. 10,126,611, which is a continuation of application No. 15/891,707, filed on Feb. 8, 2018, now Pat. No. 10,031,383, which is a continuation of application No. 15/693,564, filed on Sep. 1, 2017, now Pat. No. 9,921,440, which is a continuation of application No. 15/401,795, filed on Jan. 9, 2017, now Pat. No. 9,778,520, which is a continuation of application No. 15/212,873, filed on Jul. 18, 2016, now Pat. No. 9,575,385, which is a continuation of application No. 14/978,671, filed on Dec. 22, 2015, now Pat. No. 9,417,496, which is a continuation of application No. 14/527,841, filed on Oct. 30, 2014, now Pat. No. 9,250,491.

(51) Int. Cl.
*G02F 1/1368* (2006.01)
*H01L 27/12* (2006.01)

LIQUID CRYSTAL DISPLAY DEVICE

CROSS-REFERENCE TO RELATED APPLICATIONS

This application is a continuation of U.S. application Ser. No. 18/140,006 filed on Apr. 27, 2023, which, in turn, is a continuation of U.S. application Ser. No. 17/946,602 (now U.S. Pat. No. 11,668,982) filed on Sep. 16, 2022, which, in turn, is a continuation of Ser. No. 17/475,403 (now U.S. Pat. No. 11,480,833) filed on Sep. 15, 2021, which, in turn, is a continuation of U.S. application Ser. No. 16/953,997 (now U.S. Pat. No. 11,150,523) filed on Nov. 20, 2020, which, in turn, is a continuation of U.S. application Ser. No. 16/273,586 (now U.S. Pat. No. 10,877,325) filed on Feb. 12, 2019, which, in turn, is a continuation of U.S. application Ser. No. 16/158,402 (now U.S. Pat. No. 10,247,990) filed on Oct. 12, 2018, which, in turn, is a continuation of U.S. application Ser. No. 16/014,024 (now U.S. Pat. No. 10,126,611) filed on Jun. 21, 2018, which, in turn, is a continuation of U.S. application Ser. No. 15/891,707 (now U.S. Pat. No. 10,031,383) filed on Feb. 8, 2018, which, in turn, is a continuation of U.S. application Ser. No. 15/693,564 (now U.S. Pat. No. 9,921,440) filed on Sep. 1, 2017, which, in turn, is a continuation of U.S. application Ser. No. 15/401,795 (now U.S. Pat. No. 9,778,520) filed on Jan. 9, 2017, which, in turn, is a continuation of U.S. application Ser. No. 15/212,873 (now U.S. Pat. No. 9,575,385) filed on Jul. 18, 2016, which, in turn, is a continuation of U.S. application Ser. No. 14/978,671 (now U.S. Pat. No. 9,417,496) filed on Dec. 22, 2015, which, in turn, is a continuation of U.S. application Ser. No. 14/527,841 (now U.S. Pat. No. 9,250,491) filed on Oct. 30, 2014. Further, this application claims priority from Japanese Patent Application No. 2013-226910 filed on Oct. 31, 2013, the entire contents of which are hereby incorporated by reference into this application.

BACKGROUND

The present invention relates to a display device, and more particularly, to a liquid crystal display device with a minor reduction in transmittance and a small amount of pixel defects even in a high definition screen.

A display device includes a TFT substrate in which pixels each having a pixel electrode, a thin film transistor (TFT), and the like are arranged in a matrix form. Further, a counter substrate is disposed opposite the TFT substrate, in which color filters and the like are formed at locations corresponding to the pixel electrodes of the TFT substrate. A liquid crystal is interposed between the TFT substrate and the counter substrate. Then, an image is formed by controlling the transmittance of light through each pixel by the liquid crystal molecules.

Liquid crystal display devices are flat and lightweight and have been applied in various fields. Small liquid crystal display devices are widely used in mobile phones, digital still cameras (DSC), or other portable devices. The viewing angle property is a problem for the liquid crystal display device. The viewing angle property is a phenomenon that the brightness changes or the chromaticity changes between when the screen is viewed from the front, and when it is viewed in an oblique direction. The viewing angle property is excellent in the In Plane Switching (IPS) mode for driving liquid crystal molecules by an electric field in the horizontal direction.

Among various types in the IPS mode, for example, there is a mode in which a common electrode is formed in a matted manner and a comb-shaped pixel electrode is provided on the common electrode with an insulating film interposed therebetween, to rotate liquid crystal molecules by the electric field generated between the pixel electrode and the common electrode. This type of mode can increase the transmittance and is now mainstream. The common electrode and the interlayer insulating film are formed on an organic passivation film that also functions as a flattening film.

Meanwhile in the liquid crystal display device, when the size of the pixel is reduced for a high definition screen, the ratio of the diameter of a through hole for connecting the pixel electrode and the source electrode of the TFT is increased.

In the IPS mode liquid crystal display device described above, when the ratio of the through hole to the pixel is increased, the bonding strength between an organic passivation film and an interlayer insulating film formed on the organic passivation film is reduced, resulting in a problem that the interlayer insulating film is removed. Patent Document 1 (Japanese Patent Application Laid-Open No. 2011-59314) describes a configuration in which the interlayer insulating film is formed only on the organic passivation film and not within the through hole, in order to reduce the stress on the interlayer film to prevent the interlayer film from removing.

The pixel becomes smaller as the screen is high definition. Along with this, in order to reduce the diameter of the through hole, it is necessary to increase the taper angle of the wall part of the through hole (hereinafter also referred to as the taper angle). Meanwhile, the alignment film is used for the initial alignment of the liquid crystal molecules. The alignment film material is initially liquid and is applied by flexographic or inkjet printing, or other printing processes.

When the taper angle of the through hole is increased, there is a phenomenon that the applied alignment film material does not enter the through hole due to the surface tension. In this case, display defects occur around the through hole, such as light leakage due to the poor initial alignment of the liquid crystal molecules, and uneven brightness due to the irregularity of the film thickness. Patent Document 2 (Japanese Patent Application Laid-Open No. 2007-322563) describes a configuration in which the alignment film can easily flow into the through hole by changing the height around the upper side of the through hole.

SUMMARY

In recent years, there has been a demand for a high definition screen such as Video Graphics Array (VGA, 640×480 dots) also in small liquid crystal display devises. Here, a dot is a set of three pixels of red, green, and blue, which is equal to 1920×480 in the number of pixels. VGA can be enabled on a 3-inch screen when the short diameter of the pixel is a very small value such as 32 μm.

In order to maintain a predetermined transmittance even if the pixel becomes smaller, it is necessary to provide a TFT, a through hole, and the like, in a small area to increase the ratio of the pixel electrode to the pixel area as much as possible. When the area occupied by the through hole is reduced, the taper angle of the through hole increases. As a result, the alignment film material does not easily flow into the through hole, resulting in display defects such as light leakage due to the poor initial alignment of the liquid crystal molecules, as well as uneven brightness due to the irregularity of the film thickness.

Like the configuration described in Patent Document 2, when a height difference is provided around the upper part of the through hole, a so-called organic passivation film may not be used. The organic passivation film is thick with a film thickness of 2 to 4 μm, so that the surface is flat and it is difficult to make a height difference around the through hole.

On the other hand, it is necessary to use the organic passivation film due to requirements, such as a uniform layer thickness of the liquid crystal layer, depending on the type of the liquid crystal display device. Further, the problem of increasing the area occupied by the through hole becomes more significant when the through hole is formed in the organic passivation film, because the organic passivation film is thick with a film thickness of 2 to 4 μm.

FIG. 10 is a cross-sectional view of the problem described above in an IPS mode liquid crystal display device. In FIG. 10, a gate insulating film 101 is formed on a TFT substrate 100, and a source electrode 102 from a TFT, not shown, is formed on the gate insulating film 101. Further, an organic passivation film 103 is formed on the source electrode 102 and the gate insulating film 101. Then, a common electrode 104 is formed on the organic passivation film 103. Then, an interlayer insulating film 105 is formed so as to cover the common electrode 104, and a pixel electrode 106 with a slit 1061 is formed on the interlayer insulating film 105.

The pixel electrode 106 is connected to the source electrode 102 through a through hole 108 formed in the organic passivation film 103 and the interlayer insulating film 105. When the screen is high definition and the area of the pixel becomes smaller, it is necessary to reduce the area occupied by the through hole by increasing the taper angle α0 of the through hole 108, in order to maintain the transmittance of the pixel.

However, as shown in FIG. 10, if the taper angle α0 of the through hole 108 is large, the alignment film material, which is initially liquid, does not easily flow into the through hole from un upper base 1081 of the through hole 108. Thus, there is a problem that the alignment film is not formed within the through hole. Further, there is also a problem that the thickness of the alignment film 107 increases around the through hole, and the irregularity of the film thickness occurs in the alignment film 107. As a result, display defects occur in the through hole 108 and in the vicinity thereof, such as light leakage due to the poor initial alignment of the liquid crystal molecules as well as uneven brightness due to the irregularity of the film thickness.

An object of the present invention is to achieve a liquid crystal display device using an organic passivation film in a TFT substrate, in which the alignment film material can easily enter the through hole, even if the area occupied by the through hole is limited when the area of the pixel is reduced for a high definition screen.

The present invention is made to overcome the above problems and specific solutions are as follows.

(1) There is provided a liquid crystal display device including: a TFT substrate including a pixel in which a common electrode is formed on an organic passivation film, an interlayer insulating film is formed so as to cover the common electrode, a pixel electrode with a slit is formed on the interlayer insulating film, and a source electrode of a TFT is electrically connected to the pixel electrode through a through hole that is formed in the organic passivation film and the interlayer insulating film; and a counter substrate including a color filter at a location corresponding to the pixel, in which a black matrix is formed between each of the color filters. Further, a liquid crystal is interposed between the TFT substrate and the counter substrate. The through hole is formed in the organic passivation film in such a way that the cross section on the side near the counter substrate is the upper base, and the cross section on the side of the source electrode is the lower base. The diameter of the upper base is greater than the diameter of the lower base. The taper angle on the side near the upper base of the through hole formed in the organic passivation film is smaller than the taper angle on the side near the lower base.

(2) In the liquid crystal display device described in (1), if D is the depth of the through hole formed in the organic passivation film, the taper angle at a distance of D/6 from the upper base is smaller than the taper angle at a distance of D/3 from the upper base.

(3) In the liquid crystal display device described in (1), if D is the depth of the through hole formed in the organic passivation film, the taper angle at a distance of D/3 from the upper base is smaller than the taper angle at a distance of 2D/3 from the upper base.

(4) There is provided a liquid crystal display device including: a TFT substrate including a pixel in which a pixel electrode is formed on an organic passivation film, an interlayer insulation film is formed so as to cover the pixel electrode, a common electrode with a slit is formed on the interlayer insulating film, and a source electrode of a TFT is electrically connected to the pixel electrode through a through hole that is formed in the organic passivation film and the interlayer insulating film: and a counter substrate including a color filter at a location corresponding to the pixel, in which a black matrix is formed between each of the color filters. Further, a liquid crystal is interposed between the TFT substrate and the counter substrate. The through hole is formed in the organic passivation film in such a way that the cross section on the side near the counter substrate is the upper base, and the cross section on the side of the source electrode is the lower base. The diameter of the upper base is greater than the diameter of the lower base. The taper angle on the side near the upper base of the through hole formed in the organic passivation film, is smaller than the taper angle on the side near the lower base.

According to the present invention, in a liquid crystal display device using an organic passivation film in a TFT substrate with the pixel area reduced for a high definition screen, it is possible to stably form a liquid alignment film material within a through hole even if the diameter of the through hole is reduced. Thus, it is possible to prevent display defects such as uneven brightness due to the absence of the alignment film within the through hole, or due to the irregularity of the film thickness of the alignment film around the through hole.

DETAILED DESCRIPTION

Hereinafter, the details of the present invention will be described with reference to the preferred embodiments.

First Embodiment

Figure 1:
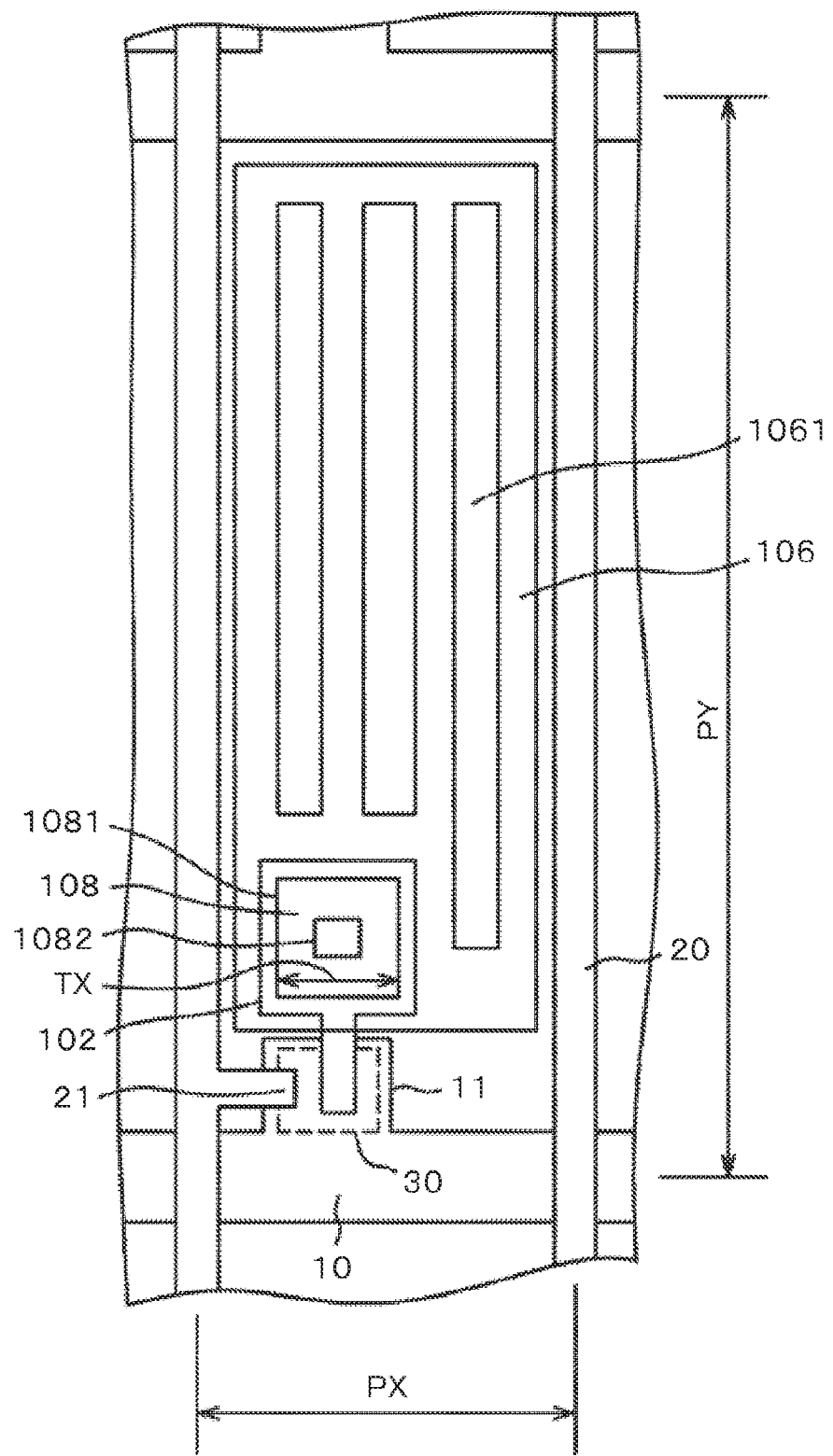
FIG. 1 is a plan view of a pixel of a liquid crystal display device to which the present invention is applied.

FIG. 1 is a plan view of a pixel in a TFT substrate 100 of a liquid crystal display device to which the present invention is applied. FIG. 1 is an example of an IPS mode liquid crystal display device. In FIG. 1, scanning lines 10 extend in the horizontal direction and are arranged in the vertical direction at a predetermined pitch PY. Further, video signal lines 20 extend in the vertical direction and are arranged in the horizontal direction at a predetermined pitch PX. An area surrounded by the scanning lines 10 and the video signal lines 20 is a pixel.

In FIG. 1, a gate electrode 11 is branched from the scanning line 10, and a semiconductor layer 30 is formed on the gate electrode 11. Then, a drain electrode 21 branched from the video signal line 20 is formed on the semiconductor layer 30. Further, a source electrode 102 is formed on the semiconductor layer 30. The source electrode 102 extends in the direction of a pixel electrode 106. The width of the source electrode 102 is increased in the area overlapping the pixel electrode 106, which is below the through hole 108. The source electrode 102 also functions as a light shielding film for preventing light leakage in the through hole 108.

In FIG. 1, the pixel electrode 106 with a slit 1061 is formed in a rectangular shape. An interlayer insulating film, not shown, is formed below the pixel electrode 106. Then, a planar common electrode, not shown, is formed below the interlayer insulating film. Then, electric lines of force from the pixel electrode 106 are formed toward the common electrode (not shown) through the portion of the slit 1061.

In FIG. 1, the pixel electrode 106 is connected to the source electrode 102 through the through hole 108. The through hole 108 is formed in the organic passivation film, not shown, whose film thickness is thick. Thus, the through hole 108 has a taper including un upper base 1081 with a large diameter as well as a lower base 1082 with a small diameter. The source electrode 102 is slightly greater than the through hole 108. The source electrode 102 also functions as a light shielding film for the through hole 108.

Figure 2A:
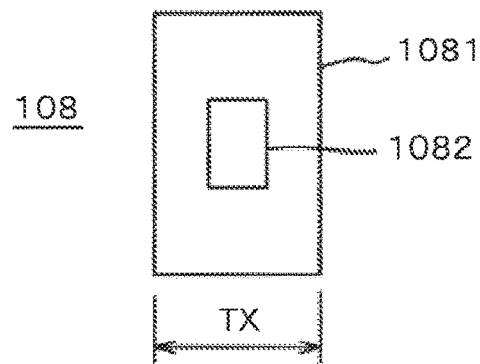
FIGS. 2A, 2B, and 2C are examples of the plane shape of a through hole.
Figure 2B:
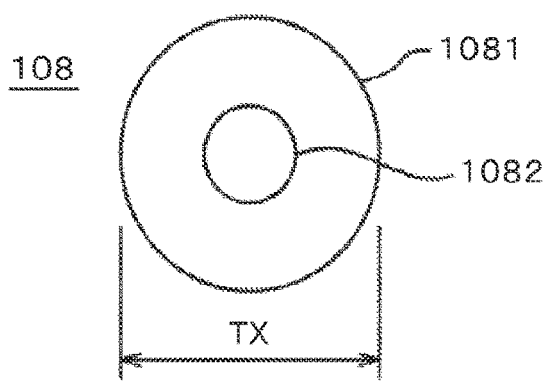
Figure 2C:
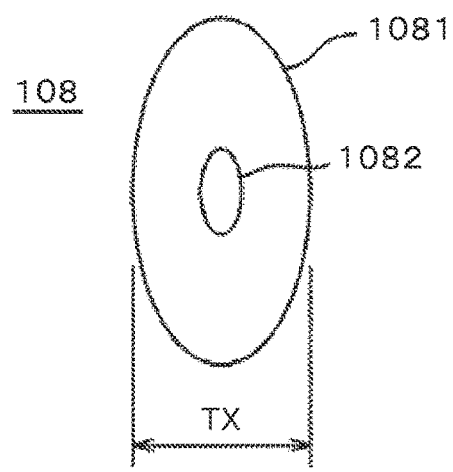

In FIG. 1, the pixel has a rectangular shape, in which the smaller diameter of the pixel is represented by PX. Further, in FIG. 1, the through hole 108 has substantially a square shape, in which the horizontal diameter of the through hole 108 is represented by TX. FIGS. 2A, 2B, and 2C are other examples of the plane shape of the through hole 108. FIG. 2A shows the through hole 108 with a rectangular shape, in which TX is the short diameter. FIG. 2B shows the through hole 108 with a circular shape. In this case, the diameter is constant and represented by TX. FIG. 2C shows the through hole 108 with an oval shape, in which TX is the short diameter.

In the high definition screen, the pixel area is reduced and the area occupied by the through hole is increased relative to the pixel area. More specifically, the present invention is particularly effective when the short diameter TX of the through hole is one fourth or more of the short diameter PX of the pixel. In order to maintain the transmittance of the pixel, the area of the through hole is reduced as the pixel area becomes small. In this case, if the taper of the through hole is increased, the alignment film material does not easily enter the through hole.

Figure 3:
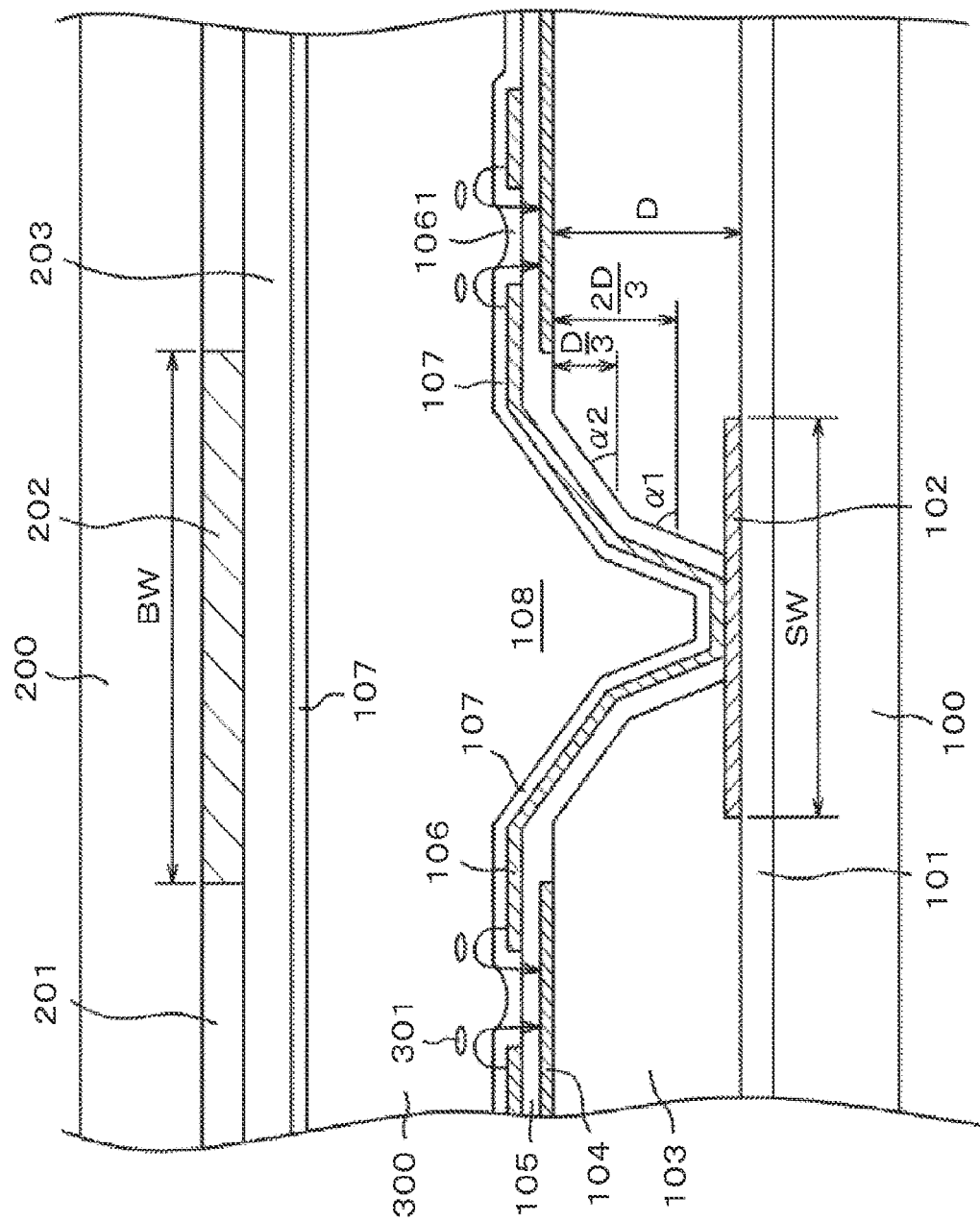
FIG. 3 is a cross-sectional view of a portion of the through hole in a pixel of a liquid crystal display device according to a first embodiment.

FIG. 3 is a cross-sectional view of the liquid crystal display device of a portion including the through hole 108 according to the present invention, which is designed to address the above problem. In FIG. 3, the gate insulating film 101 is formed on the TFT substrate 100, the source electrode 102 is formed on the gate insulating film 101, and the organic passivation film 103 is formed on the source electrode 102. This is the same as in the conventional example. The feature of the present invention is the shape of the through hole 108 in the organic passivation film 103.

In FIG. 3, the through hole 108 formed in the organic passivation film 103 has a folding point, in which the taper angle α2 on the upper side is smaller than the taper angle α1 on the lower side. However, the diameter of the upper base of the organic passivation film 103 is the same as the diameter of the conventional example. Thus, the ratio of area of the through hole to the pixel is the same as that in the conventional example.

The common electrode 104 is formed of indium tin oxide (ITO) in a planar shape on the organic passivation film 103. The common electrode 104 is covered by the interlayer insulating film 105. The interlayer insulating film 105 is formed along the organic passivation film 103, in which the through hole 108 is formed. The pixel electrode 106 is formed on the interlayer insulating film 105. The pixel electrode 106 is connected to the source electrode 102 in the through hole 108, so that a video signal is supplied to the pixel electrode 106 through the TFT.

Figure 10:
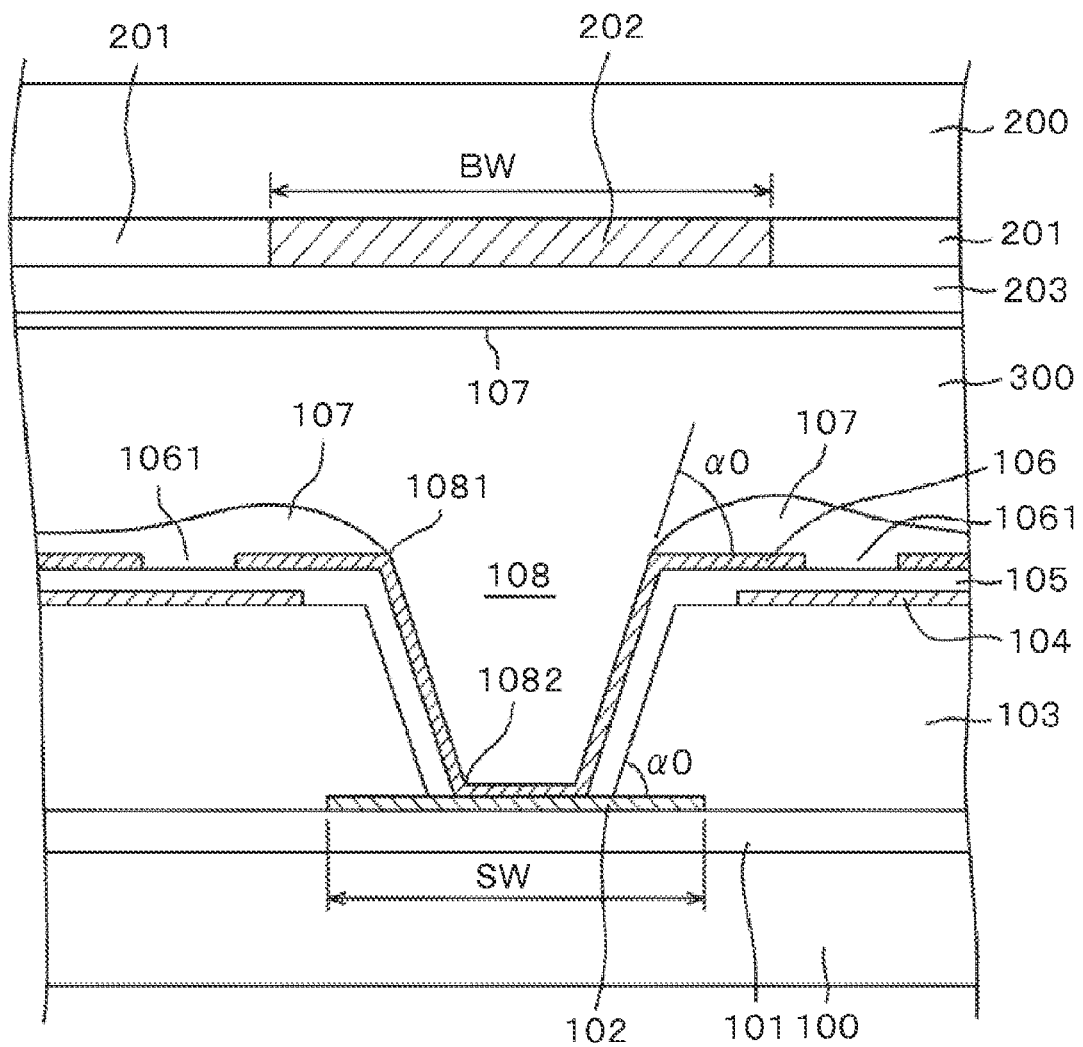
FIG. 10 is a cross-sectional view around the through hole in a liquid crystal display device of a conventional example.

The pixel electrode 106 has the slit 1061. Electric lines of force from the pixel electrode 106 extend down to the common electrode 104 through the slit 1061. Liquid crystal molecules 301 are driven by the electric lines of force to control the transmittance of light in the pixel. The alignment film 107 is formed on the pixel electrode 106. The taper angle on the upper side of the through hole 108 is small, so that the alignment film material, which is initially liquid, can easily enter the through hole 108. Thus, in the present invention, the problem that the alignment film material does not enter the through hole 108 as shown in FIG. 10 is solved.

In FIG. 3, the counter substrate 200 is disposed opposite the TFT substrate 100, and the liquid crystal layer 300 is interposed between the TFT substrate 100 and the counter substrate 200. In the counter substrate 200, a color filter is formed at a location corresponding to the pixel electrode 106. However, a black matrix 202 is formed at a location corresponding to the through hole 108. The portion of the through hole 108 does not contribute to image formation, so that the light is blocked by the black matrix 202 in order to increase the contrast. An overcoat film 203 is formed so as to cover the color filter 201 and the black matrix 202. Then, the alignment film 107 is formed so as to cover the overcoat film 203.

Figure 4:
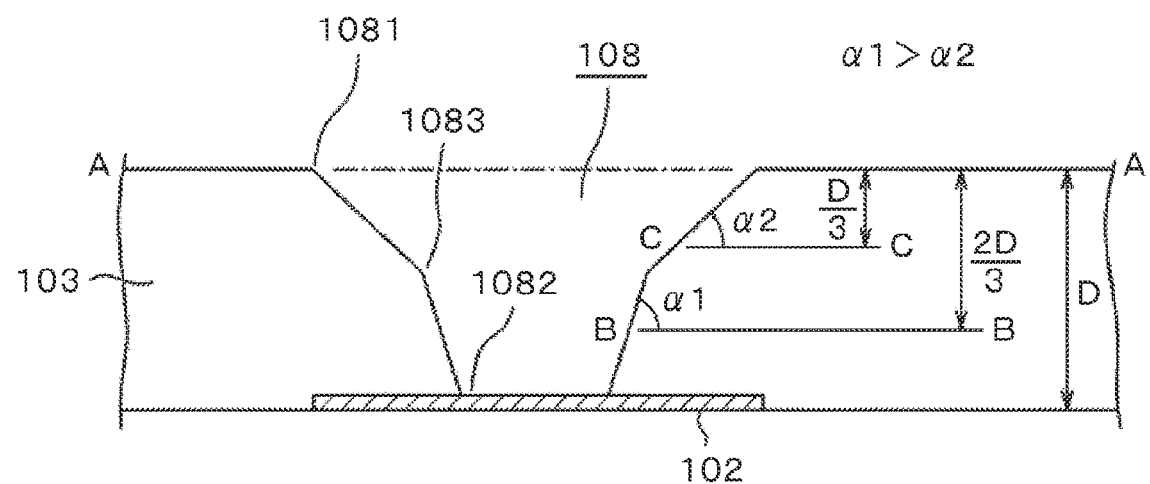
FIG. 4 is a cross-sectional view of the through hole formed in an organic passivation film according to the first embodiment.

In FIG. 3, the film thickness of the organic passivation film 103 in the TFT substrate 100 is greater than the film thickness of the other films. Thus, the shape of the through hole 108 is determined by the shape of the through hole 108 of the organic passivation film 103. FIG. 4 is a cross-sectional view of the shape of the part of the through hole 108 of the organic passivation film 103. The film thickness D of the organic passivation film 103 is about 2 to 4 μm, which is very thick compared to the other films.

Photosensitive resin is used for the organic passivation film 103, so that there is no need to use a resist for patterning. Examples of the photosensitive resin are an acrylic resin, a silicon resin, and the like. Further, a positive type photosensitive resin is used in which the taper angle can be controlled by heating after development.

In FIG. 4, the taper angle $\alpha 2$ around the upper base of the through hole is smaller than the taper angle $\alpha 1$ around the lower base. This is to allow the alignment film material to easily flow into the through hole. In FIG. 4, the through hole has a folding point 1083 between the upper base 1081 and the lower base 1082. Because of this, there is a difference between the taper angle in the upper base 1081 and the taper angle in the lower base 1082. In FIG. 4, the taper angle $\alpha 2$ around the upper base 1081 of the through hole is 10 degrees or more and 60 degrees or less, and more preferably, 10 degrees or more and 50 degrees or less.

In FIG. 4, if D is the film thickness of the organic passivation film 103, the taper angle $\alpha 2$ at a distance of D/3 from the upper surface of the organic passivation film 103 is smaller than the taper angle $\alpha 1$ at a distance of 2D/3 from the upper surface of the organic passivation film 103. Or more specifically, there is a part in which the taper angle at a distance of D/3 or less from the upper surface of the organic passivation film 103, is smaller than the taper angle at a distance of 2D/3 or more from the upper surface of the passivation film.

In FIG. 4, the taper angle $\alpha 2$ on the upper side is measured by using the C-C line as the reference. The C-C line is parallel to the A-A line, which is the line connecting the upper surfaces of the organic passivation film 103. Further, the taper angle $\alpha 1$ on the lower side is measured by using the B-B line as the reference. The B-B line is parallel to the A-A line, which is the line connecting the upper surfaces of the organic passivation film 103.

As described above, the taper angle on the side of the upper base 1081 of the through hole 108 is made smaller than the taper angle on the side of the lower base 1082 by providing the folding point 1083 in the through hole 108. This method can be performed by half exposure. In other words, the organic passivation film 103 is formed of a positive type photosensitive resin, so that it is possible to make a difference in the taper angle in such a way that the amount of exposure around the upper base 1081 is smaller than the amount of exposure around the lower base 1082.

The half exposure is performed by changing the transmittance of the mask. More specifically, it is possible to control the transmittance of light, for example, by allowing complete transmission of light around the center of the through hole 108 while completely blocking light on the outside of the through hole 108, and by forming, for example, small slits in the part to be half exposed in the middle section of the through hole 108. The taper angle can be controlled by changing the density of the slits in the half exposed part.

Figure 5:
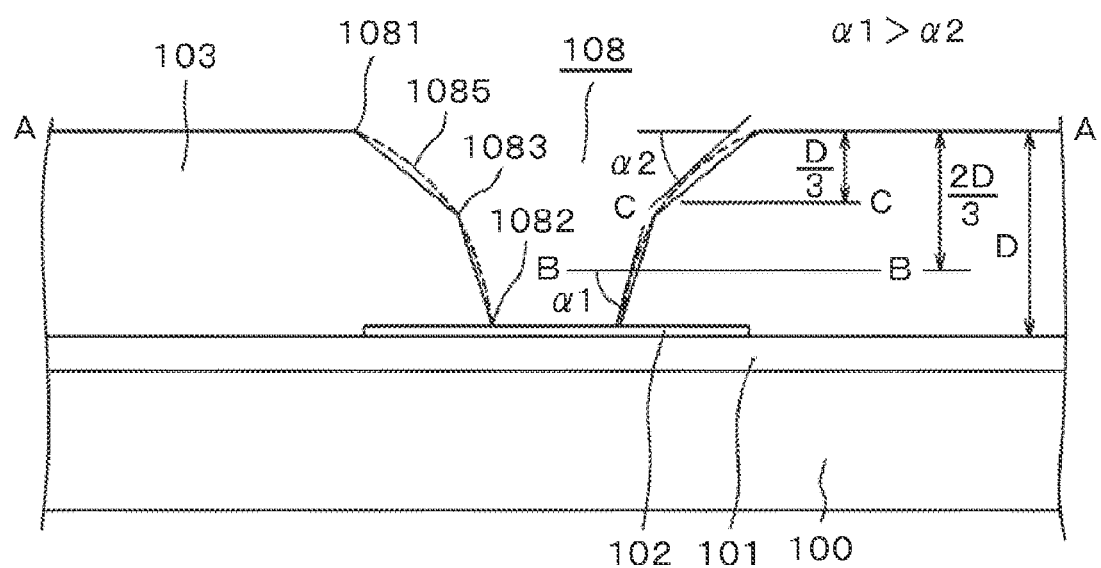
FIG. 5 is a cross-sectional view of the through hole formed in the organic passivation film with a smooth wall surface according to the first embodiment.

In the present invention, a positive type photosensitive resin is used for the organic passivation film 103, so that the taper of the through hole 108 can be smoothed by heating after development. FIG. 5 is an example in which the taper is smoothed by heating after development, in which a dashed line 1085 shows the shape of the through hole 108 after heating. In this case, the folding point is not often seen clearly.

In FIG. 5, if D is the film thickness of the organic passivation film 103, the angle $\alpha 2$ of the edge of the wall of the through hole 108 located at a distance of D/3 from the upper surface of the organic passivation film 103 with respect to the C-C line, is smaller than the angle $\alpha 1$ of the edge of the wall of the through hole 108 located at a distance of 2D/3 from the upper surface with respect to the B-B line. Or more specifically, there is a part in which the taper angle of the edge of the wall of the through hole 108 located at a distance of D/3 or less from the upper surface of the organic passivation film 103 with respect to the C-C line, is smaller than the taper angle of the edge of the wall of the through hole 108 located at a distance of 2D/3 or more from the upper surface of the organic passivation film 103 with respect to the B-B line. Here, the B-B line and the C-C line are parallel to the A-A line connecting the upper surfaces of the organic passivation film 103.

Figure 6:
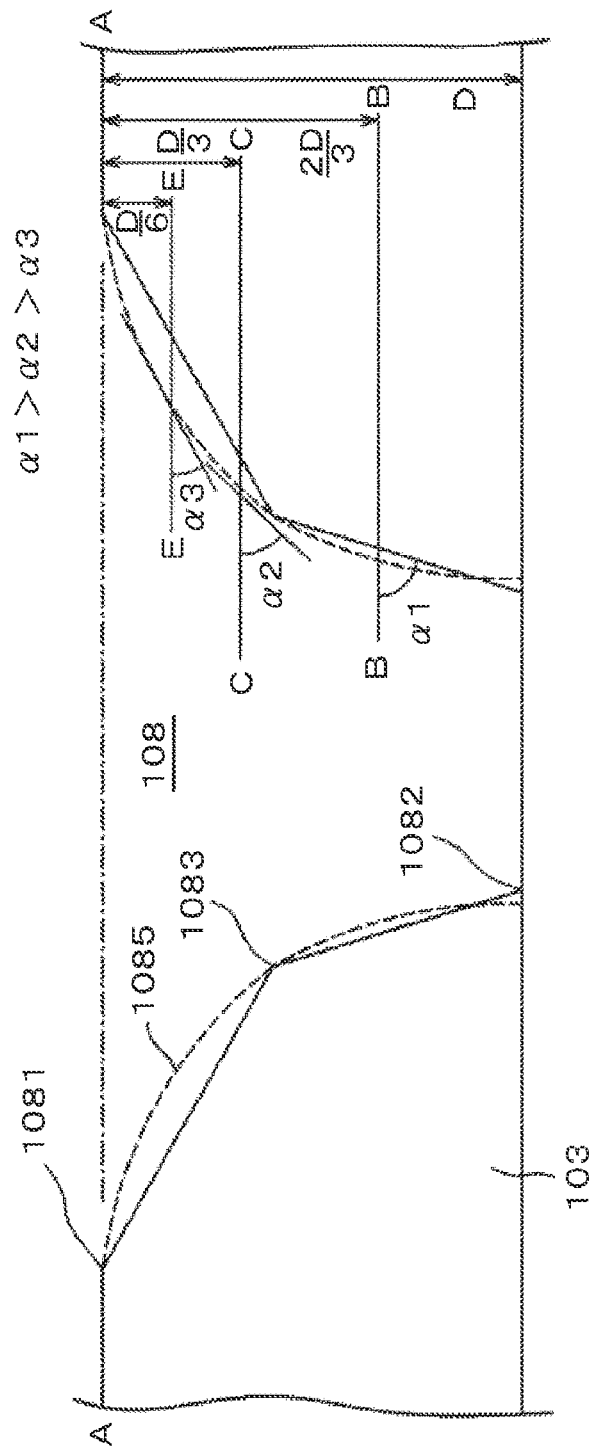
FIG. 6 is a detailed cross-sectional view of FIG. 5.

FIG. 6 is a further detailed cross-sectional view of an example in which the taper of the through hole is smoothed by heating after development, in which the dashed line 1085 shows the shape of the through hole after heating. In FIG. 6, if D is the film thickness of the organic passivation film 103, an angle $\alpha 3$ of the edge of the wall of the through hole 108 located at a distance of D/6 from the upper surface of the organic passivation film 103 with respect to the E-E line, is smaller than the angle $\alpha 2$ of the edge of the wall of the through hole 108 located at a distance of D/3 from the upper surface with respect to the C-C line. Or more specifically, there is a part in which the angle of the edge of the wall of the through hole 108 located at a distance of D/6 or less from the upper surface of the organic passivation film 103 with respect to the E-E line, is smaller than the angle of the edge of the wall of the through hole 108 located at a distance of D/3 or more from the upper surface of the organic passivation film 103 with respect to the C-C line. Here, the E-E line and the C-C line are parallel to the A-A line connecting the upper surfaces of the organic passivation film 103.

Further, in FIG. 6, the relationship between the angles $\alpha 2$ and $\alpha 1$ is the same as the relationship described in FIG. 5. Thus, in FIG. 6, the taper angles of the through hole have the relationship as follows: $\alpha 1 < \alpha 2 < \alpha 3$. In other words, in FIG. 6, the higher in the through hole 108 the smaller the taper angle of the through hole 108. Thus, the through hole 108 shown in FIG. 6 has a shape such that the liquid alignment film material can easily flow into the through hole. Further, the greater and steeper the taper angle $\alpha 1$ is, the more the effective ratio of the through hole to the pixel area can be reduced. As a result, the effect of increasing the transmittance of the pixel can also be expected. In FIG. 6, the taper angle $\alpha 1$ is 60 degrees or more, and more preferably, 70 degrees or more.

Figure 7:
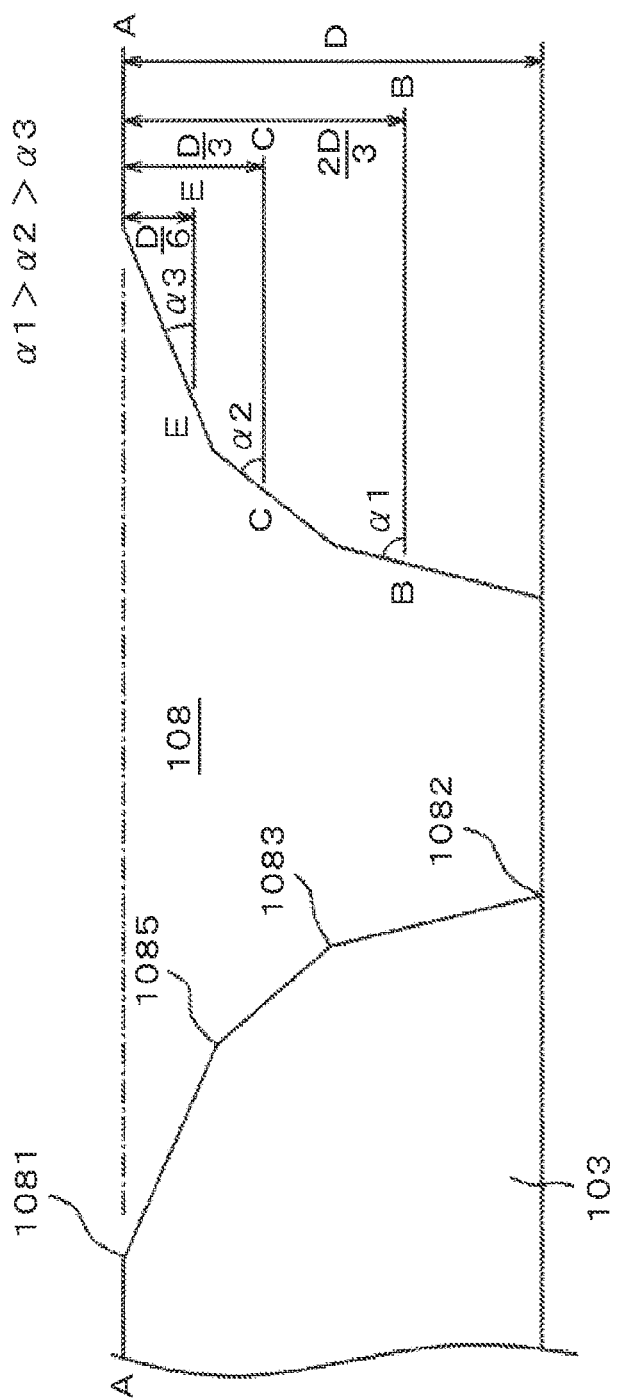
FIG. 7 is a cross-sectional view of the through hole in which three types of taper angles are formed according to the first embodiment.

FIG. 7 is a cross-sectional view of the through hole 108 having a structure in which two folding points are provided in the through hole 108, and three types of taper angles are formed in the through hole 108 in such a way that the closer the taper angle is to the side of the upper base 1081 of the through hole 108, the smaller the degree of taper angle. The through hole 108 shown in FIG. 7 can be formed by using two types of half exposures with different transmittance values.

In FIG. 7, if D is the film thickness of the organic passivation film 103, α3 is the taper angle at a distance of D/6 down from the upper surface of the through hole 108, α2 is the taper angle at a distance of D/3 down from the upper surface of the through hole 108, and α1 is the taper angle at a distance of 2D/3 down from the upper surface of the through hole 108. The E-E line is used as the reference line for the taper angle α3, the C-C line is used as the reference line for the taper angle α2, and the B-B line is used as the reference line for the taper angle α1. These reference lines are parallel to the A-A line connecting the upper surfaces of the organic passivation film 103, respectively. In FIG. 7, the taper angle α3 around the upper base of the through hole 108 is 10 degrees or more and 45 degrees or less, and more preferably, 10 degrees or more and 30 degrees or less.

FIG. 7 is a cross-sectional view of the through hole 108 after development. Since the organic passivation film 103 is positive type, the shape of the through hole 108 is smoothed by heating after development. The two folding points 1083 disappear and a smooth curve can be formed in such a way that the closer the taper angle is to the side of the upper base 1081 of the through hole 108, the smaller the degree of the taper angle. Further, the greater and steeper the taper angle α1 is, the more the effective ratio of the through hole to the pixel area can be reduced. As a result, the effect of increasing the transmittance of the pixel can also be expected. In FIG. 7, the taper angle α1 is 60 degrees or more, and more preferably, 70 degrees or more.

Figure 8:
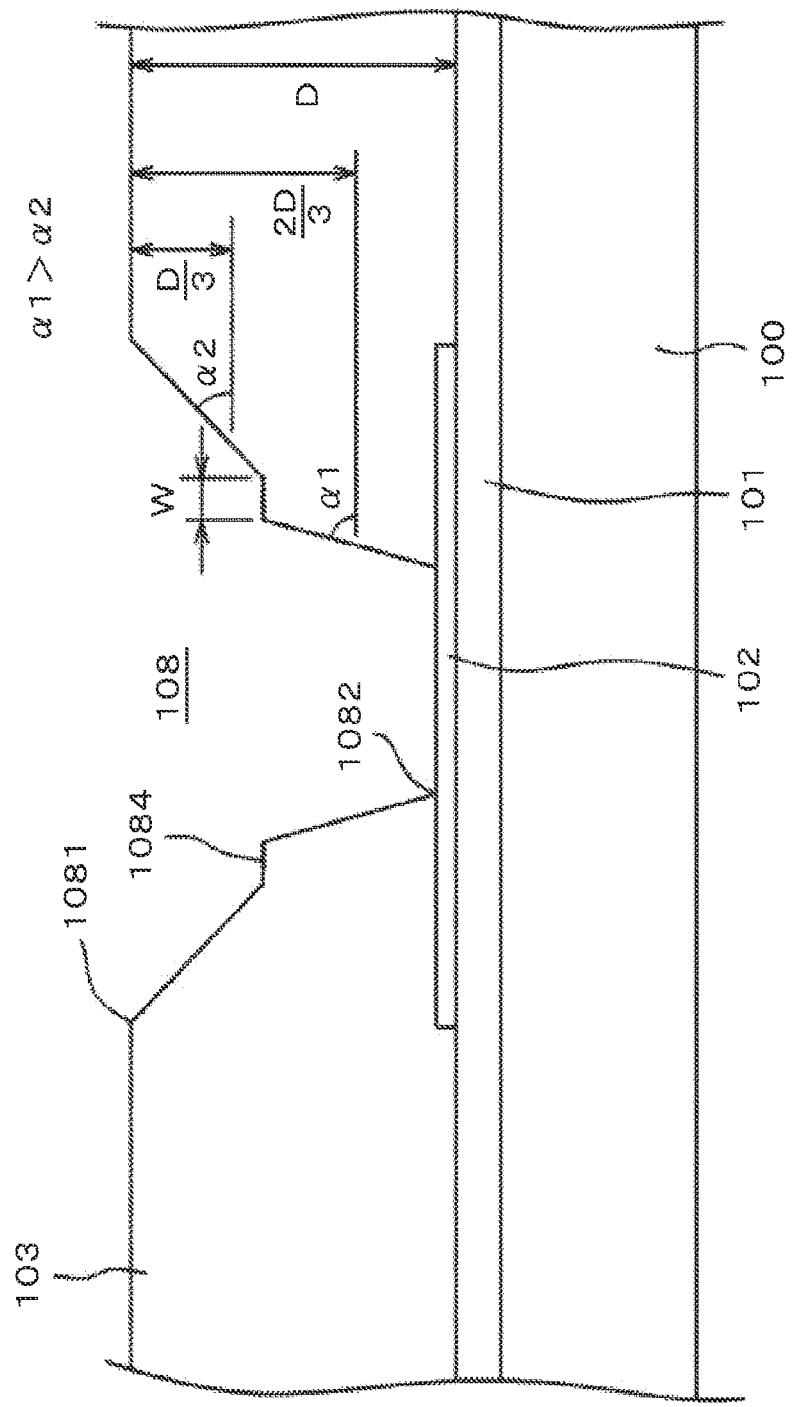
FIG. 8 is a cross-sectional view of an example of the through hole in which a step is formed between a first taper angle and a second taper angle according to the first embodiment.

FIG. 8 is a cross-sectional view of another form of the through hole 108 according to the present embodiment. FIG. 8 is different from FIG. 4 and other figures in that a step 1084 is formed between a first wall surface with the taper angle α1, and a second wall surface with the taper angle α2. Here, the taper angle α2 is the taper angle at a distance of D/3 from the upper surface of the through hole 108. Further, the taper angle α1 is the taper angle at a distance of 2D/3 from the upper surface of the through hole 108.

In FIG. 8, the taper angle α2 is smaller than the taper angle α1. In FIG. 8, the taper angle α2 around the upper base 1081 of the through hole 108 is 10 degrees or more and 60 degrees or less, and more preferably, 10 degrees or more and 50 degrees or less.

The angle between the taper angle α1 and the step 1084 is large but the width w of the step is small, so that the alignment film material, which is liquid, does not stay in this portion. On the other hand, the taper angle α2 of the second wall near the upper surface of the through hole 108 is small, so that the alignment film material stays around the upper base 1081 of the through hole 108, thereby preventing the phenomenon that the alignment film material does not flow into the through hole 108. Thus, even if the through hole 108 has the shape of FIG. 8, the alignment film material can still easily flow into the through hold. Further, the greater and steeper the taper angle α1 is, the more the effective ratio of the through hole to the pixel area can be reduced. As a result, the effect of increasing the transmittance of the pixel can also be expected.

Second Embodiment

In the present invention, as shown in FIG. 3 or 4 in the first embodiment, the folding points are formed in the through hole 108, and the taper angle at the position close to the upper base of the through hole 108 is made smaller than the taper angle at the position close to the lower base of the through hole 108. Because of this configuration, the alignment film material can easily flow into the through hole 108, so that the alignment film 107 can be uniformly formed also within the through hole 108. By taking advantage of this technique, it is possible to achieve alignment of the liquid crystal molecules 301 also within the through hole 108, and to increase the transmittance of the pixel.

Figure 9:
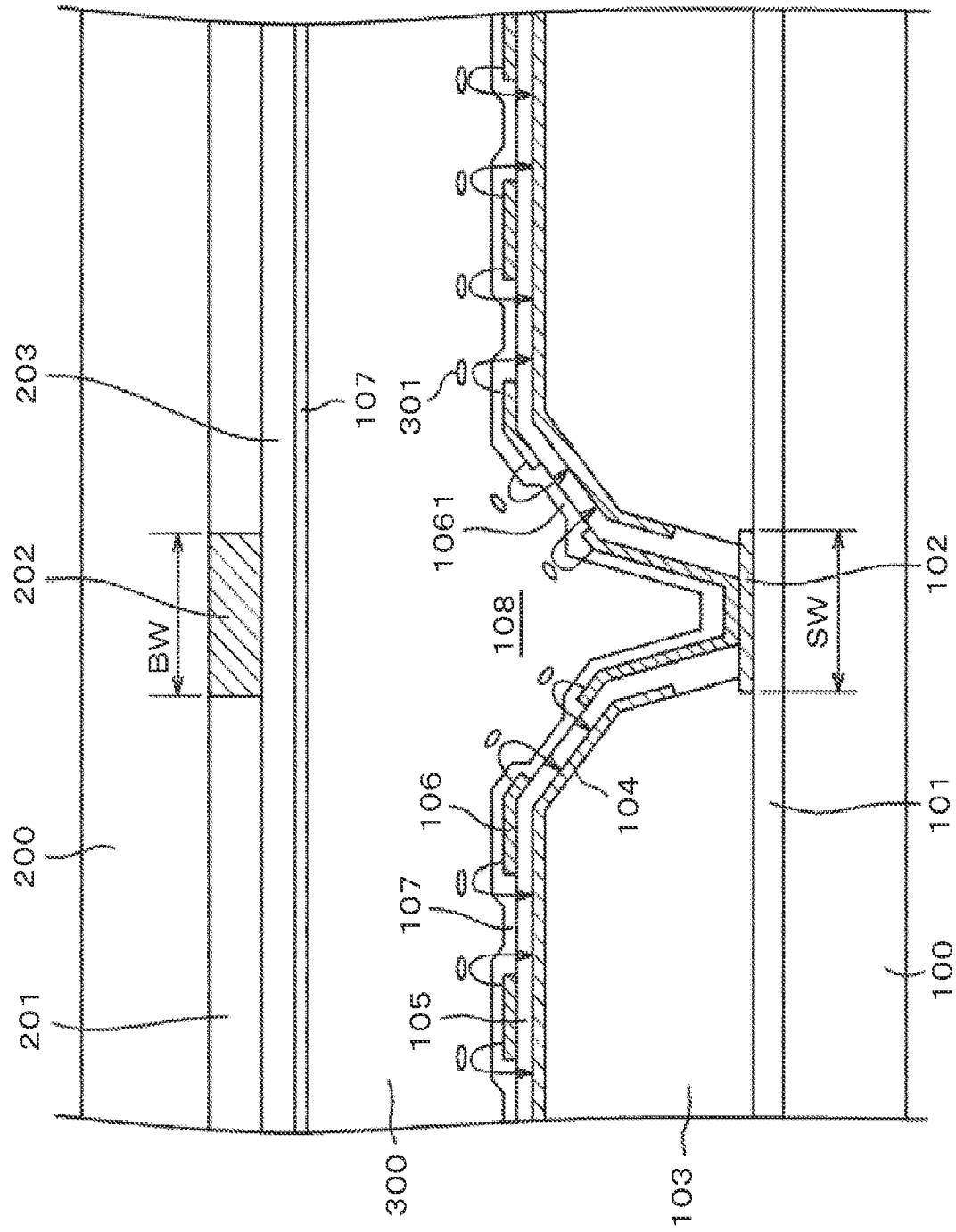
FIG. 9 is an example of a liquid crystal display device according to a second embodiment, in which the inside of the through hole is also used for image formation.

In FIG. 9 showing the present embodiment, the organic passivation film 103 is formed on the gate insulating film 101. The through hole 108 is formed in the organic passivation film 103 in such a way that the taper angle on the side near the upper base of the through hole 108 is smaller than the taper angle on the side near the lower base of the through hole 108. The common electrode 104 is formed on the organic passivation film 103 to a position close to the lower base of the through hole 108. However, the common electrode 104 is not electrically connected to the source electrode 102 formed on the gate insulating film 101.

The interlayer insulating film 105 is formed so as to cover the common electrode 104. Then, the pixel electrode 106 is formed on the interlayer insulating film 105. The slit 1061 is formed in the pixel electrode 106, which extends to the through hole 108. Thus, according to the configuration shown in FIG. 9, it is possible to control the liquid crystal molecules 301 even within the through hole 108. In other words, the part of the through hole 108 can also be used for image formation. As a result, the transmittance of the pixel can be increased and the brightness of the screen can be increased.

The alignment film 107 is formed on the pixel electrode 106, in which the taper angle on the side near the upper base of the through hole 108 is made small so that the alignment film material can easily flow into the through hole 108. Because of this configuration, the alignment film 107 can be formed uniformly also within the through hole 108. As a result, the inner part of the through hole 108 in which the common electrode 104 is formed and the slit 1061 of the pixel electrode 106 is formed, can also be used for image formation.

In the existing configuration, the liquid crystal molecules 301 are not controlled within the through hole 108, so that the source electrode 102 having the role of a light shielding film covers over the through hole 108 in the lower part of the through hole 108 to prevent light leakage in the through hole 108. Further, the black matrix 202 for blocking light formed in the counter substrate 200 also covers over the through hole 108. Because of this configuration, the transmittance of the pixel is reduced.

As can be seen by comparing FIG. 9 in the present embodiment with FIG. 3 in the first embodiment, the width SW of the source electrode for blocking light, as well as the width BW of the black matrix shown in FIG. 9 are smaller than those shown in FIG. 3. In other words, the area of the source electrode 102 as well as the area of the black matrix 202 formed in the counter substrate 200 shown in FIG. 9, are smaller than the area of the source electrode 102 as well as the area of the black matrix 202 formed in the counter substrate 200 shown in FIG. 3. Because of this, the transmittance of the pixel can be increased in the configuration of FIG. 9. In particular, when the taper angle at a distance of D/3 from the upper base of the through hole is made smaller and more moderate, and when the taper angle at a distance of 2D/3 from the upper base of the through hole is made steeper, the area capable of effective display can be provided without the influence of the thickness of the liquid crystal layer. At the same time, the effect of increasing the transmittance of the pixel is significant. Note that the configuration of the counter substrate 200 in FIG. 9 is the same as the configuration described in FIG. 3 except that the area of the black matrix 202 is small, so that the description thereof is omitted.

It is necessary to perform the alignment treatment of the alignment film 107 to provide the initial alignment of the liquid crystal molecules 301. In the rubbing treatment performed in the past, it is difficult to rub the alignment film 107 including the concave portion. On the other hand, there is a so-called photo-alignment treatment, which is a method for providing uniaxial anisotropy to the alignment film 107 by polarized ultraviolet light. The photo-alignment can emit ultraviolet light also to the inside of the through hole 108. Thus, it is possible to perform the alignment treatment on the alignment film within the through hole 108.

In the present invention, the taper angle of the through hole 108 is small in the part close to the upper base of the through hole 108. Thus, it is easy to form the slit 1061 of the pixel electrode 106 in this part of the through hole 108 to use it as an area for image formation.

The forgoing has described the configuration of a so-called pixel electrode top in which the common electrode 104 is formed on the organic passivation film 103, the interlayer insulating film 105 is formed so as to cover the common electrode 104, and the pixel electrode 106 with the slit 1061 is formed on the interlayer insulating film 105. On the other hand, there is a configuration of a so-called common electrode top in which the pixel electrode 106 is formed on the organic passivation film 103, the interlayer insulating film 105 is formed so as to cover the pixel electrode 106, and the common electrode 104 with a slit is formed on the interlayer insulating film 105. Also in this configuration, the pixel electrode 106 is connected to the source electrode 102 within the through hole 108 on which the interlayer insulating film 105 is formed, and the common electrode 104 is formed on the interlayer insulating film 105 over the through hole.

The present invention can also be applied to an IPS mode liquid crystal display device of such a common electrode top structure. In other words, there is the effect of allowing the liquid crustal material to easily flow into the through hold in such a way that the taper angle on the side near the upper base of the through hole of the organic passivation film 103 is made smaller than the taper angle on the side near the lower base, which is the same as described in the first embodiment. In addition, there is the effect of allowing the inside of the through hole to also contribute to image formation by forming a slit in the common electrode 104 within the though hole, which is the same as described in the second embodiment.

Further, TFT used as a switching element of the pixel has two structures: the top gate structure and the bottom gate structure. The configuration shown in FIG. 3 assumes a bottom gate type TFT, but the present invention is not limited to this example. The present invention can be applied to all types of TFT structures. Further, in the above embodiments, the description has been given by taking the IPS mode liquid crystal display device as an example. However, the present invention can also be applied to liquid crystal display devices of other types having an alignment film.

While the above has described the configuration in which the organic passivation film is directly formed on the gate insulating film and the source electrode, the present invention can also be applied to the configuration in which an inorganic passivation film of SiN and the like is formed on the gate insulating film and the source electrode.

Further, in the configuration described above, the color filter is formed in the counter substrate. However, the present invention can also be applied to the configuration in which the color filter is formed on the side of the TFT substrate. Further, in the above embodiments, it is also possible that a colored organic passivation film is used as the color filter. Also in this case, the present invention can be applied without problem. In other words, in these cases, the present invention can be applied under the assumption that the color filter corresponds to the organic passivation film in each of the embodiments.

What is claimed is:

1. A display device comprising:
a first substrate including an organic insulation layer, a first electrode on the organic insulation layer, an inorganic insulating layer on the first electrode, a second electrode on the inorganic insulating layer, a photo-alignment layer on the inorganic insulating layer and the second electrode, and a metal layer between the substrate and the organic insulation layer;
a second substrate; and
a liquid crystal material between the first substrate and the second substrate,
wherein
the organic insulation layer has a through hole, and the second electrode connects the metal layer via the through hole,
the second electrode has a slit,
a part of the second electrode, a part of the photo-alignment layer, and a part of the slit are positioned in the through hole, and
the through hole has a portion that has a diameter which is larger than a width of the metal layer.

2. The display device according to claim 1,
wherein
the second substrate includes a black layer and a color filter, and
the through hole has a portion that has a diameter which is larger than a width of the black layer.

3. The display device according to claim 2,
wherein
the second electrode connects the metal layer at an area which is between the metal layer and the black layer.

4. The display device according to claim 3,
wherein the color layer overlaps the first electrode and the second electrode in plane view.

5. The display device according to claim 1, further comprising a switching element,
wherein the metal layer is a one electrode of the switching element.

6. The display device according to claim 5,
wherein
the first electrode is a common electrode, and the second electrode is a pixel electrode.

7. The display device according to claim 6,
wherein
the second substrate includes a black layer and a color filter, and
the through hole has a portion that has a diameter which is larger than a width of the black layer.

8. The display device according to claim 7,
wherein
the pixel electrode connects the metal layer at an area which is between the metal layer and the black layer.

9. The display device according to claim 8,
wherein the color layer overlaps the common electrode and the pixel electrode in plan view.

* * * * *